(12) United States Patent
Haza et al.

(10) Patent No.: US 11,228,330 B2
(45) Date of Patent: Jan. 18, 2022

(54) DISTRIBUTION OF CLIPPING NOISE BETWEEN BANDS

(71) Applicant: Nokia Solutions and Networks Oy, Espoo (FI)

(72) Inventors: Grzegorz Haza, Lutynia (PL); Radoslaw Ceszkiel, Wroclaw (PL); Gunter Wolff, Laupheim (DE); Björn Jelonnek, Ulm (DE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 17/066,960

(22) Filed: Oct. 9, 2020

(65) Prior Publication Data
US 2021/0119657 A1 Apr. 22, 2021

(30) Foreign Application Priority Data
Oct. 16, 2019 (FI) ..................................... 20195895

(51) Int. Cl.
*H04B 1/12* (2006.01)
*H03F 1/32* (2006.01)
(Continued)

(52) U.S. Cl.
CPC ........... *H04B 1/126* (2013.01); *H03F 1/3241* (2013.01); *H03F 3/24* (2013.01); *H04B 1/1027* (2013.01);
(Continued)

(58) Field of Classification Search
CPC .... H03F 1/3241; H03F 3/24; H03F 2200/102; H03F 2200/451; H04B 1/1027; H04B 1/14
See application file for complete search history.

(56) References Cited

U.S. PATENT DOCUMENTS 10,367,670 B2 * 7/2019 Wang .................. H04L 27/2618
10,727,880 B1 * 7/2020 Pratt ................. H04L 25/03885
(Continued)

FOREIGN PATENT DOCUMENTS

WO 2014/067301 A1 5/2014
WO 2016/001781 A1 1/2016
(Continued)

OTHER PUBLICATIONS

Chen et al., "Multi-dimensional Crest Factor Reduction and Digital Predistortion for Multi-band Radio-overfiber Links", Optics Express, vol. 22, No. 17, Aug. 2014, pp. 20982-20993.
(Continued)

*Primary Examiner* — Freshteh N Aghdam
(74) *Attorney, Agent, or Firm* — Harrington & Smith

(57) ABSTRACT

A method comprising: obtaining a first radio signal and a second radio signal, determining a first envelope signal based on the first radio signal and a second envelope signal based on the second radio signal, determining a preview envelope signal based on the first envelope signal and the second envelope signal, determining a common clipping gain signal based on the preview envelope signal, determining a first clipping gain signal based on the common clipping gain signal and a first weighing factor, determining a second clipping gain signal based on the common clipping gain signal and a second weighing factor, performing a first crest factor reduction for the first radio signal utilizing the first clipping gain signal, and performing a second crest factor reduction for the second radio signal utilizing the second clipping gain signal.

22 Claims, 13 Drawing Sheets

(51) Int. Cl.
*H03F 3/24* (2006.01)
*H04B 1/10* (2006.01)
*H04B 1/14* (2006.01)

(52) U.S. Cl.
CPC ......... *H04B 1/14* (2013.01); *H03F 2200/102* (2013.01); *H03F 2200/451* (2013.01)

(56) References Cited

U.S. PATENT DOCUMENTS

| | | | |
|---|---|---|---|
| 2004/0258175 | A1 | 12/2004 | Vuopala et al. |
| 2005/0232373 | A1* | 10/2005 | Peeters ............... H04L 27/2624 375/296 |
| 2006/0120479 | A1 | 6/2006 | Cai et al. |
| 2008/0247487 | A1* | 10/2008 | Cai ..................... H04L 27/2623 375/296 |
| 2012/0106680 | A1* | 5/2012 | Wernears ............ H04L 27/2614 375/340 |
| 2013/0027090 | A1 | 1/2013 | Morris et al. |
| 2013/0163512 | A1 | 6/2013 | Rexberg et al. |
| 2014/0169496 | A1 | 6/2014 | Yang et al. |
| 2014/0362950 | A1* | 12/2014 | Fehri ....................... H04L 5/001 375/296 |
| 2014/0362951 | A1 | 12/2014 | Fehri et al. |
| 2017/0187560 | A1 | 6/2017 | Ng et al. |

FOREIGN PATENT DOCUMENTS

WO 2018/227111 A1 12/2018
WO 2019/094713 A1 5/2019

OTHER PUBLICATIONS

Office action received for corresponding Finnish Patent Application No. 20195895, dated May 8, 2020, 9 pages.
Extended European Search Report received for corresponding European Patent Application No. 20201498.1, dated Mar. 10, 2021, 7 pages.

* cited by examiner

DISTRIBUTION OF CLIPPING NOISE BETWEEN BANDS

FIELD

The following exemplary embodiments relate to radio frequency units that are used to transmit and receive signals at various frequency bands.

BACKGROUND

Signal processing is a part of wireless communication that requires hardware and software to function effectively and reliably. Effective use of hardware resources helps to save costs and may be at least partly achieved using software algorithms.

BRIEF DESCRIPTION OF THE INVENTION

The scope of protection sought for various embodiments of the invention is set out by the independent claims. The exemplary embodiments and features, if any, described in this specification that do not fall under the scope of the independent claims are to be interpreted as examples useful for understanding various embodiments of the invention.

According to an aspect there is provided an apparatus comprising means for obtaining a first radio signal and a second radio signal, determining a first envelope signal based on the first radio signal and a second envelope signal based on the second radio signal, determining a preview envelope signal based on the first envelope signal and the second envelope signal, determining a common clipping gain signal based on the preview envelope signal, determining a first clipping gain signal based on the common clipping gain signal and a first weighing factor, determining a second clipping gain signal based on the common clipping gain signal and a second weighing factor, performing a first crest factor reduction for the first radio signal utilizing the first clipping gain signal, and performing a second crest factor reduction for the second radio signal utilizing the second clipping gain signal.

According to another aspect there is provided an apparatus comprising at least one processor, and at least one memory including a computer program code, wherein the at least one memory and the computer program code are configured, with the at least one processor, to cause the apparatus to: obtain a first radio signal and a second radio signal, determine a first envelope signal based on the first radio signal and a second envelope signal based on the second radio signal, determine a preview envelope signal based on the first envelope signal and the second envelope signal, determine a common clipping gain signal based on the preview envelope signal, determine a first clipping gain signal based on the common clipping gain signal and a first weighing factor, determine a second clipping gain signal based on the common clipping gain signal and a second weighing factor, perform a first crest factor reduction for the first radio signal utilizing the first clipping gain signal, and perform a second crest factor reduction for the second radio signal utilizing the second clipping gain signal.

According to another aspect there is provided a method comprising obtaining a first radio signal and a second radio signal, determining a first envelope signal based on the first radio signal and a second envelope signal based on the second radio signal, determining a preview envelope signal based on the first envelope signal and the second envelope signal, determining a common clipping gain signal based on the preview envelope signal, determining a first clipping gain signal based on the common clipping gain signal and a first weighing factor, determining a second clipping gain signal based on the common clipping gain signal and a second weighing factor, performing a first crest factor reduction for the first radio signal utilizing the first clipping gain signal, and performing a second crest factor reduction for the second radio signal utilizing the second clipping gain signal.

According to another aspect there is provided a computer program product readable by a computer and, when executed by the computer, configured to cause the computer to execute a computer process comprising obtaining a first radio signal and a second radio signal, determining a first envelope signal based on the first radio signal and a second envelope signal based on the second radio signal, determining a preview envelope signal based on the first envelope signal and the second envelope signal, determining a common clipping gain signal based on the preview envelope signal, determining a first clipping gain signal based on the common clipping gain signal and a first weighing factor, determining a second clipping gain signal based on the common clipping gain signal and a second weighing factor, performing a first crest factor reduction for the first radio signal utilizing the first clipping gain signal, and performing a second crest factor reduction for the second radio signal utilizing the second clipping gain signal.

According to another aspect there is provided a computer program product comprising computer-readable medium bearing computer program code embodied therein for use with a computer, the computer program code comprising code for obtaining a first radio signal and a second radio signal, determining a first envelope signal based on the first radio signal and a second envelope signal based on the second radio signal, determining a preview envelope signal based on the first envelope signal and the second envelope signal, determining a common clipping gain signal based on the preview envelope signal, determining a first clipping gain signal based on the common clipping gain signal and a first weighing factor, determining a second clipping gain signal based on the common clipping gain signal and a second weighing factor, performing a first crest factor reduction for the first radio signal utilizing the first clipping gain signal, and performing a second crest factor reduction for the second radio signal utilizing the second clipping gain signal.

A system comprising a first apparatus configured to transmit radio signals and a second apparatus configured to receive the transmitted radio signals, wherein the system is further configured to: transmit, by the first apparatus, a first radio signal and a second radio signal, receive, by the second apparatus, the first radio signal and the second radio signal, determine a first envelope signal based on the first radio signal and a second envelope signal based on the second radio signal, determine a preview envelope signal based on the first envelope signal and the second envelope signal, determine a common clipping gain signal based on the preview envelope signal, determine a first clipping gain signal based on the common clipping gain signal and a first weighing factor, determine a second clipping gain signal based on the common clipping gain signal and a second weighing factor, perform a first crest factor reduction for the first radio signal utilizing the first clipping gain signal, and perform a second crest factor reduction for the second radio signal utilizing the second clipping gain signal.

A system comprising means for obtaining a first radio signal and a second radio signal, determining a first envelope signal based on the first radio signal and a second envelope signal based on the second radio signal, determining a preview envelope signal based on the first envelope signal and the second envelope signal, determining a common clipping gain signal based on the preview envelope signal, determining a first clipping gain signal based on the common clipping gain signal and a first weighing factor, determining a second clipping gain signal based on the common clipping gain signal and a second weighing factor, performing a first crest factor reduction for the first radio signal utilizing the first clipping gain signal, and performing a second crest factor reduction for the second radio signal utilizing the second clipping gain signal.

LIST OF DRAWINGS

In the following, the invention will be described in greater detail with reference to the embodiments and the accompanying drawings, in which.

DESCRIPTION OF EMBODIMENTS

Figure 1:
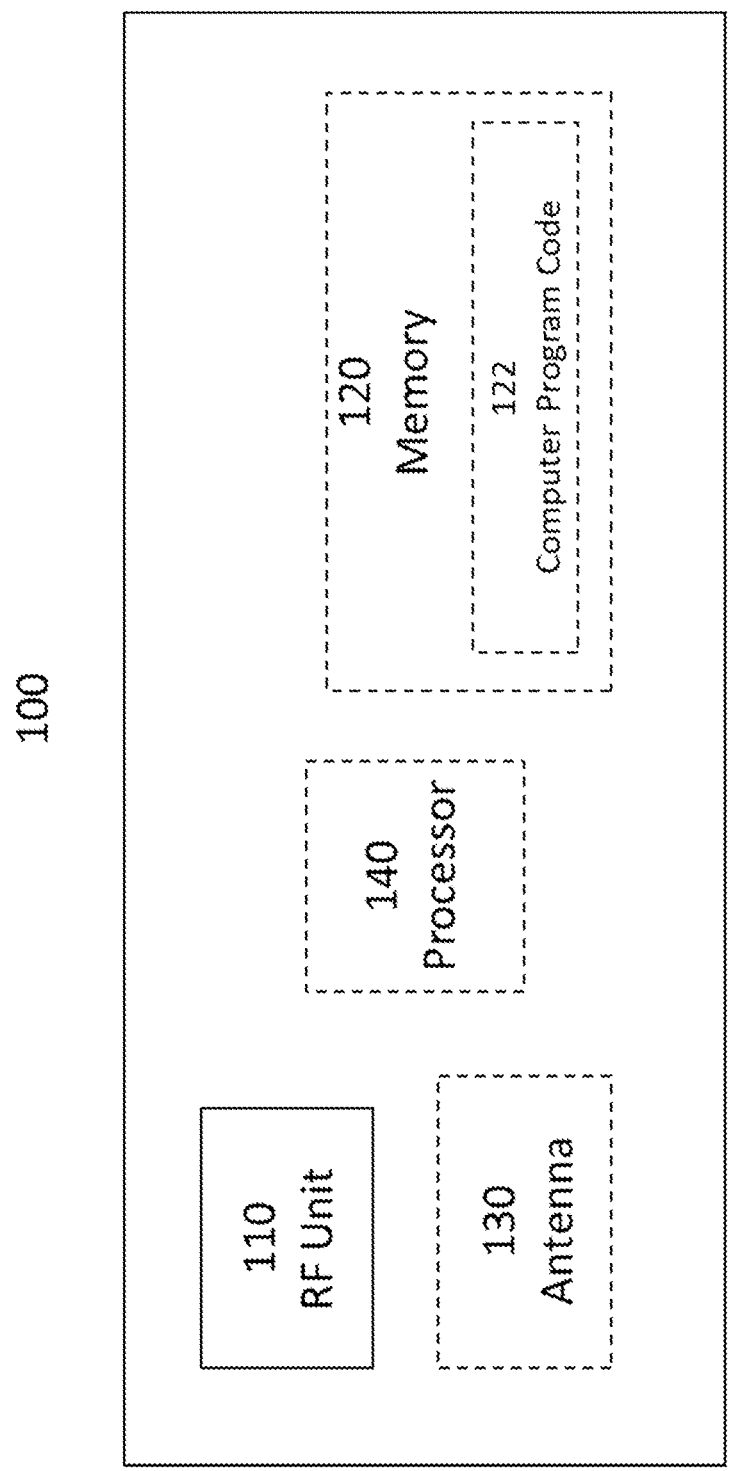
FIG. 1 illustrates an exemplary embodiment of an apparatus.

The following embodiments are exemplifying. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

As used in this application, the term 'circuitry' refers to all of the following: (a) hardware-only circuit implementations, such as implementations in only analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device. The above-described embodiments of the circuitry may also be considered as embodiments that provide means for carrying out the embodiments of the methods or processes described in this document.

The techniques and methods described herein may be implemented by various means. For example, these techniques may be implemented in hardware (one or more devices), firmware (one or more devices), software (one or more modules), or combinations thereof. For a hardware implementation, the apparatus(es) of embodiments may be implemented within one or more application-specific integrated circuits (ASICs), digital signal processors (DSPs), digital signal processing devices (DSPDs), programmable logic devices (PLDs), field programmable gate arrays (FPGAs), graphics processing units (GPUs), processors, controllers, micro-controllers, microprocessors, other electronic units designed to perform the functions described herein, or a combination thereof. For firmware or software, the implementation can be carried out through modules of at least one chipset (e.g. procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

FIG. 1 illustrates an apparatus 100, which comprises a radio frequency unit, RF unit 110, which may be a logical unit in some exemplary embodiments. The RF unit 110 may be comprised in an apparatus that comprises an antenna 130, a processor 140 and/or a memory 120. Alternatively, the RF unit may be connected to one or more of the antenna 130, the processor 140 and/or the memory 120. The apparatus 100 may be an apparatus such as, or comprised in, a terminal device, or an access node for example.

The RF Unit 110 enables wireless connectivity to external networks. The RF Unit 110 is connected to, or comprises, the antenna 130. The antenna 130 may comprise one or more antennas. The RF unit 110 may comprise an integrated circuit or a set of integrated circuits that provide the wireless communication capability for the apparatus 100. The RF unit 110 is configured to transmit and receive radio frequency signals and, in some exemplary embodiments, to process the signals. It is to be noted that the RF unit 110 may comprise hardware and/or software for realizing communication connectivity according to one or more communication protocols. In some exemplary embodiments, the RF unit 110 is configured to modulate a radio wave to carry data and to transmit the radio wave. Additionally, or alternatively, the RF unit 110 may be configured to receive a modulated radio wave and to demodulate the received modulated radio wave. Further, additionally or alternatively, the RF unit 110 may comprise a microcontroller configured to handle data packetization and/or managing a communications protocol.

The processor 140 interprets computer program instructions and processes data. The processor 140 may comprise one or more programmable processors. The processor 140 may comprise programmable hardware with embedded firmware and may, alternatively or additionally, comprise one or more application specific integrated circuits, ASICs. The processor 140 is coupled to a memory 120. The processor is configured to read and write data to and from the memory 120. The memory 120 may comprise one or more memory units. The memory units may be volatile or non-volatile. It is to be noted that in some example embodiments there may be one or more units of non-volatile memory and one or more units of volatile memory or, alternatively, one or more units of non-volatile memory, or, alternatively, one or more units of volatile memory. Volatile memory may be for example RAM, DRAM or SDRAM. Non-volatile memory may be for example ROM, PROM, EEPROM, flash memory, optical storage or magnetic storage. In general, memories may be referred to as non-transitory computer readable media. The memory 120 stores computer readable instructions that are execute by the processor 140. For example, non-volatile memory stores the computer readable instructions and the processor 140 executes the instructions using volatile memory for temporary storage of data and/or instructions. The computer readable instructions may have been pre-stored to the memory 122 or, alternatively or additionally, they may be received, by the apparatus, via electromagnetic carrier signal and/or may be copied from a physical entity such as computer program product. Execution of the computer readable instructions causes the apparatus 100 to perform functionality described above.

In the context of this document, a "memory" or "computer-readable media" may be any non-transitory media or means that can contain, store, communicate, propagate or transport the instructions for use by or in connection with an instruction execution system, apparatus, or device, such as a computer.

It is to be noted that the apparatus 100 may further comprise various component not illustrated in the FIG. 1. The various components may be hardware component and/or software components.

When a signal is received, for example by an RF unit such as the RF unit 110, filtering may be applied to extract the correct RF bandwidth. The signal may also be amplified which may enable better processing of the received signal. For signal processing purposes, a peak amplitude of a received signal may be determined. Peak amplitude may be understood as a maximum absolute value of the signal in view of a reference. The reference may be for example zero and as such the peak amplitude may be understood as the maximum value of difference compared to the zero.

A crest factor is a parameter that may be used to indicate how different peak values in a waveform of the signal are compared to the effective value of the waveform. The higher the crest factor, the greater the peaks of the waveform. The crest factor may be determined by dividing the peak amplitude of the waveform by the root mean square, RMS, value of the waveform. A peak-to-average power ratio, PAPR, may be understood as indicating the average power of the waveform. The PAPR may be determined by dividing the squared peak amplitude by the RMS value squared.

A peak-to-average ratio, PAR, on the other hand indicates the ratio of the peak power level to the time-averaged power level in an electrical circuit. The PAR may be determined for various signal parameter such as voltage, current, power, frequency and phase.

The smaller the crest factor, the more bits per second may typically be transmitted. Therefore, modulation techniques with small crest factors may be desirable and crest factor reduction, CFR, techniques are useful as they enable more bits per second to be transmitted using the same hardware resources. Examples of CFR techniques include peak windowing, noise shaping, pulse injection and peak cancellation. Minimum crest factor occurs in a waveform that has a constant envelope signal. An envelope signal may be understood as a curve outlining the extremes of a signal's waveform. A constant envelope signal therefore may be understood as an envelope signal for a sinusoidal waveform that is in equilibrium.

A signal may be limited once its amplitude exceeds a threshold. This limitation may be understood as clipping. Clipping may introduce noise to the clipped signal. Clipping effectively distorts the signal thereby limiting the amplitudes to a threshold value.

In data communication information is transferred using modulated sine waves that may be called carriers. To effectively transmit information, a single frequency sine wave may not be sufficient. Therefore, a plurality of sine waves that form a composite signal may be utilized. The bandwidth of such a composite signal may be understood as the difference between the highest and the lowest frequencies comprised in the composite signal.

Figure 2:
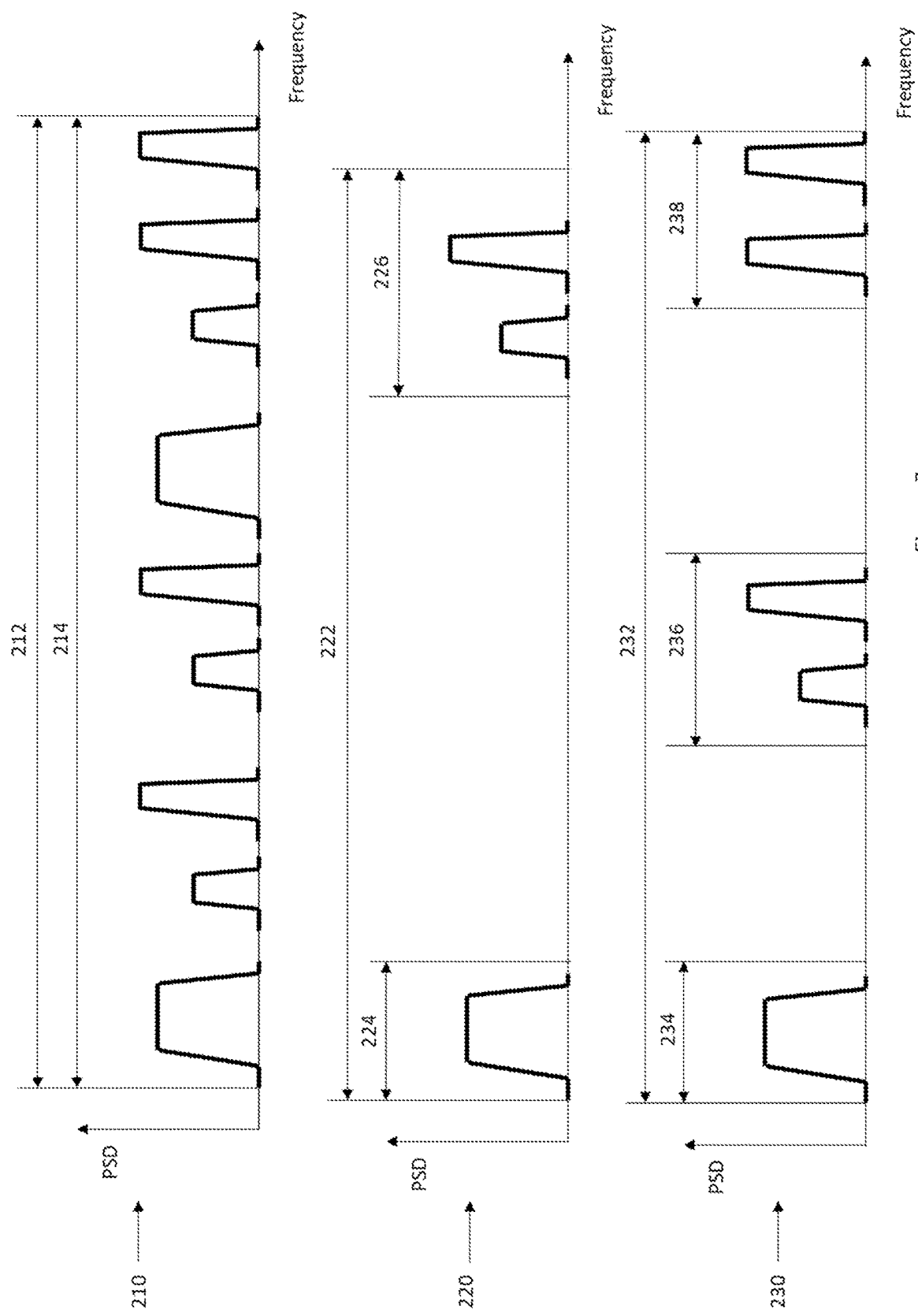
FIG. 2 illustrates examples of radio bandwidth configurations.

Radio signals, which may be carriers or composite signals, may be characterized by their corresponding radio bandwidth. FIG. 2 illustrates this by indicating a radio bandwidth 212, 222 and 232. The radio bandwidth may be limited due to various factors such as cost, performance requirements and physical properties of an apparatus such as the apparatus 100. However, in some exemplary embodiments a radio bandwidth may comprise two or more separate RF bands such as those illustrated in FIG. 2, RF bands 214, 224, 226, 234, 236 and 238, that have a gap in between them. In such exemplary embodiments, a question arises regarding how to handle each RF band. One solution is to allocate an RF unit, such as an RF unit 110, for each band.

FIG. 2 illustrates a wideband configuration 210 in which the RF band 214 corresponds to the radio bandwidth 212. Another configuration illustrated in FIG. 2 is the dual-band configuration 220 in which the RF bands 224 and 226 have a gap in between them and are comprised in the radio bandwidth 222. Yet another configuration illustrated in FIG. 2 is the multi-band configuration 230 in which the RF bands 234, 236 and 238 have a gap in between them and are comprised in the radio bandwidth 232. It is to be noted that a dual-band configuration may also be understood as a multi-band configuration.

In an exemplary embodiment, an RF unit, such as the RF unit 110, is used to process all RF bands in a dual- and multiband configurations. In the dual-band and multi-band configuration the signals may be placed within the assigned RF bands separated by the frequency gaps between them. Each RF band covers a certain frequency region, the width of which is defined as the RF bandwidth, RF BW. The RF BW may be understood as an RF band specific parameter that is different for each RF band.

When CFR is performed as part of signal processing, the processing effort needed increases as the radio bandwidth of the signal may increase. If the wideband CFR is used for the dual- or multi-band signal, the two or more separate RF bands are still interpreted as one wideband corresponding to the radio bandwidth. Consequently, the signal processing must operate at sampling rates that match with the radio bandwidth of the radio signal although only part of the radio bandwidth is occupied by the radio signal. Therefore, the aspect that only a part of the radio bandwidth is occupied by the radio signal may be utilized to reduce the signal processing effort required for CFR.

In a multi-band configuration, which includes a dual-band configuration, a preview signal is utilized to provide information regarding position and level of each peak comprised in a radio signal. The information may then be used by the CFR algorithm to limit the signal power, thus reducing the resulting PAR. In the CFR algorithm, each band is processed in a separate path, but the band specific clipping signal is generated using the information from all bands at the same time.

Figure 3:
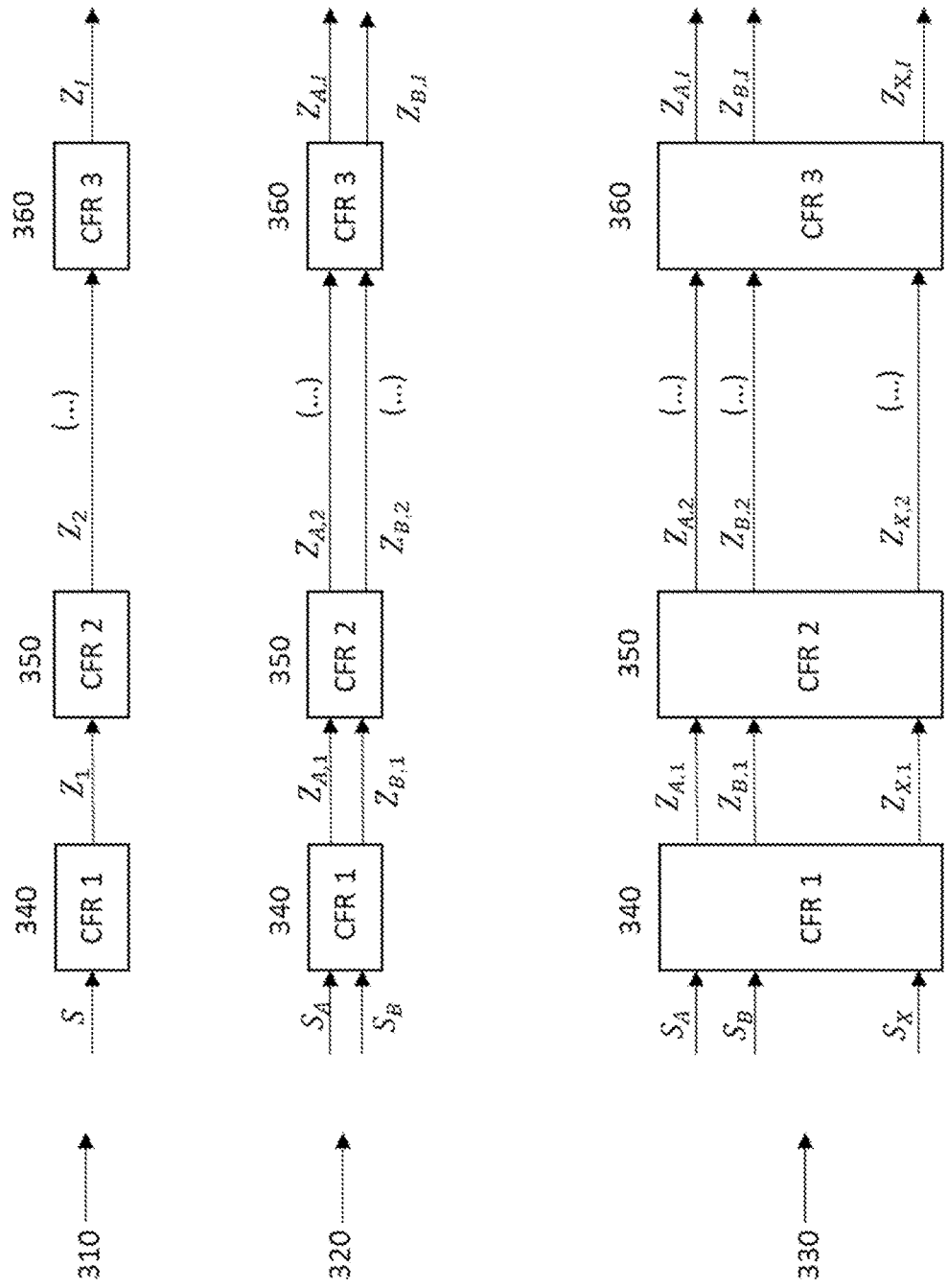
FIG. 3 illustrates examples of crest factor reduction.

FIG. 3 illustrates the difference between wideband CFR 310, dual-band CFR 320 and multi-band CFR 330. The CFR in this exemplary embodiment is an iterative procedure which gradually reduces the peak to average power ratio (PAR) of the radio signal. The block diagrams 340, 350 and 360 illustrate the various iteration rounds of CFR applied to the radio signals. In the wideband CFR 310 a radio signal S and clipped signals $Z_1, Z_2, \ldots, Z_I$ for wideband are illustrated in the block diagram exemplifying the signal processing chain. In the dual-band CFR 320 radio signals $S_A$ and $S_B$ as well as clipped signals $Z_{A,1}, Z_{A,2}, \ldots, Z_{A,I}$ that are in an RF band A and clipped signals $Z_{B,1}, Z_{B,2}, \ldots, Z_{B,I}$ that are in an RF band B are illustrated in the block diagram exemplifying the signal processing chain. A processing chain for multi-band CFR 330 is illustrated in FIG. 3 as well. The multi-band CFR 330 is a generalization of the dual-band mode. Radio signals $S_A$, $S_B$ and up to $S_X$ as well as clipped signals $Z_{A,1}, Z_{A,2}, \ldots, Z_{A,I}$ that are in an RF band A, clipped signals $Z_{B,1}, Z_{B,2}, \ldots, Z_{B,I}$ that are in an RF band B and up to clipped signals $Z_{X,1}, Z_{X,2}, \ldots, Z_{X,I}$ that are in an RF band X are illustrated in the block diagram exemplifying the signal processing chain. It is to be noted that the number of CFR iteration rounds is not limited.

For the sake of simplifying discussion of exemplary embodiments, dual-band configurations are discussed from now on, but it is to be noted that the multi-band configuration is a generalization of the dual-band configuration and therefore the exemplary embodiments discussed are applicable to multi-band configurations as well.

Figure 4:
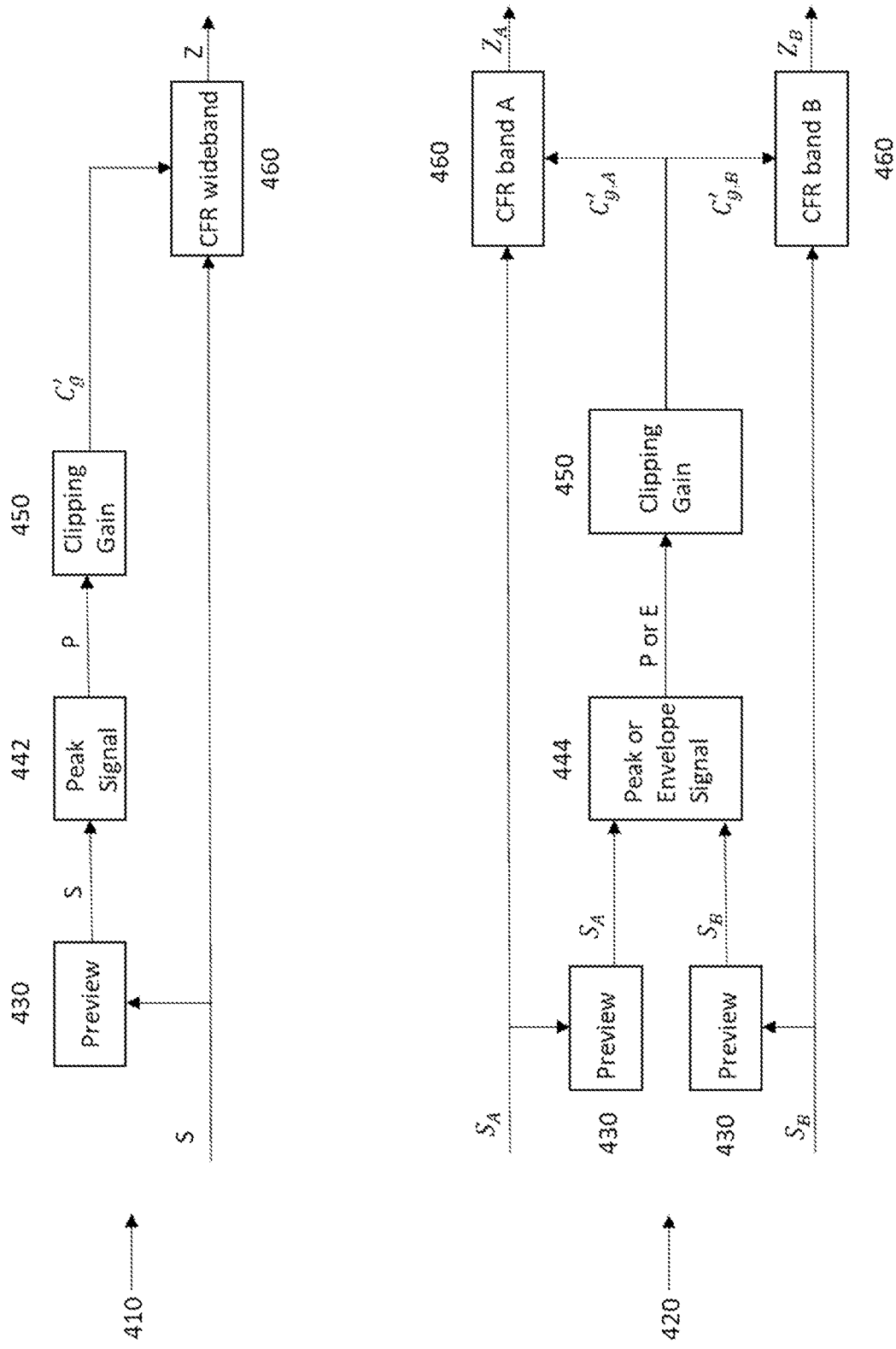
FIG. 4 illustrates a block diagram of an exemplary embodiment of crest factor reduction.

In FIG. 4, a block diagram of an exemplary embodiment of a single iteration of a CFR applied in a wideband configuration 410 is illustrated. A composite signal S is fed to the input of the CFR block 460 as well as to the preview block 430. The preview block 430 performs oversampling to meet requirements regarding clipping accuracy. Then the composite signal S with increased time resolution is fed to the Peak Signal block 442 and is used to generate a peak signal P. The clipping gain block 450 then uses the peak signal P to generate clipping gain signal $C'_g$. The clipping gain signal $C'_g$ is then used by the CFR wideband block 460 to provide the clipped signal Z.

In FIG. 4 a block diagram of an exemplary embodiment of a single iteration of a CFR applied in a dual-band configuration 420 is also illustrated. A composite signal $S_A$ for a first RF band, RF band A and a composite signal $S_B$ for a second RF band, RF band B are fed to the CFR blocks 460 for RF band A and B and to the preview blocks 430. The preview blocks 430 oversample the composite signals to meet requirements regarding clipping accuracy. The composite signals $S_A$ and $S_B$ with increased time resolution are then used to generate either a peak signal P or an envelope signal E in a peak or envelope signal block 444. The clipping gain block 450 then uses either the signal P or E in order to generate clipping gain signals $C'_{g,A}$ and $C'_{g,B}$. Each clipping gain signal is used by its corresponding CFR block CFR 460 for RF band A or for RF band B, to provide clipped signals $Z_A$ and $Z_B$. The CFR blocks 460 illustrated in the exemplary embodiments of FIG. 4 may be implemented as an additive or as a multiplicative clipper. It is to be noted that determining may also be understood as generating.

Figure 5:
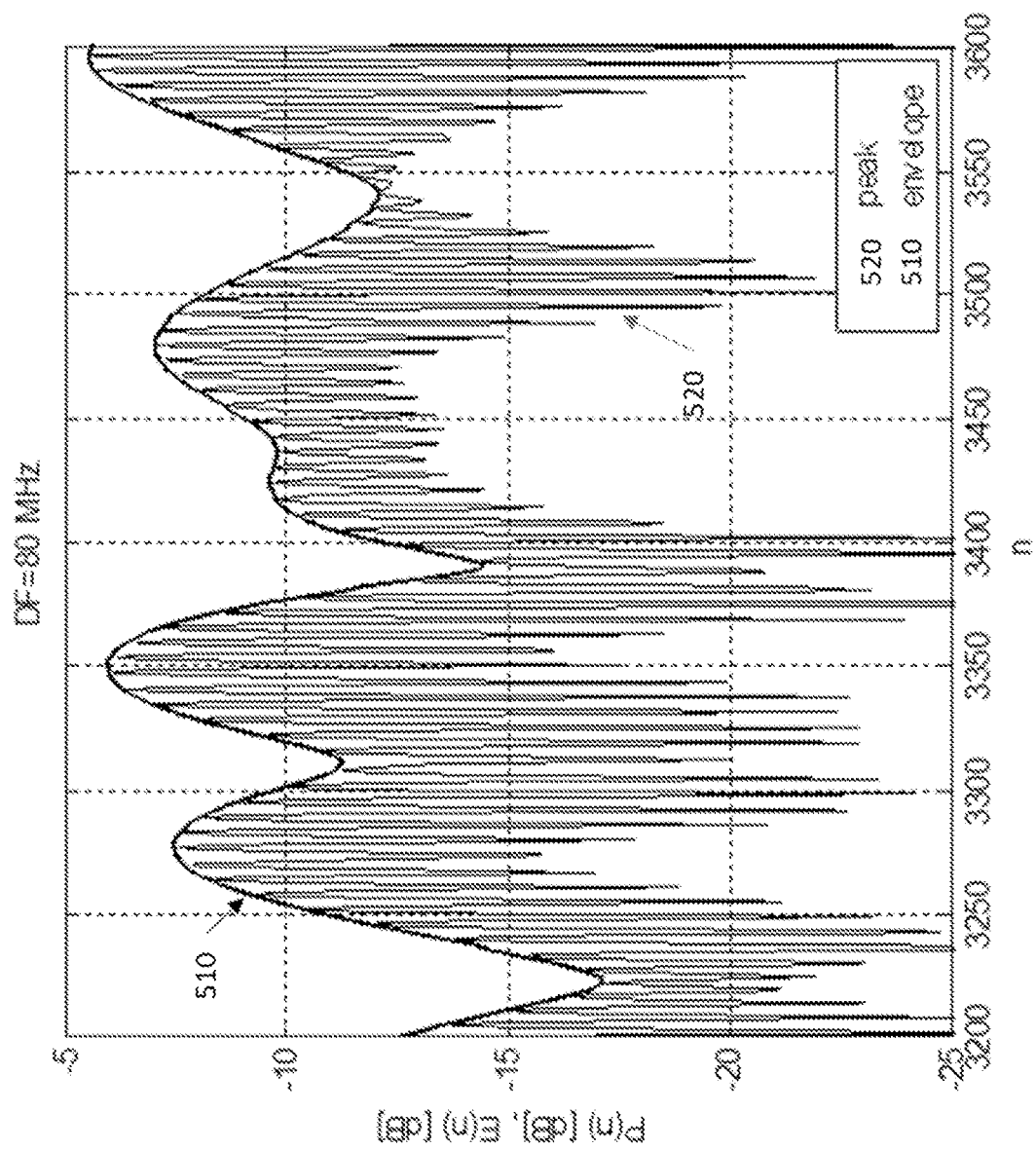
FIGS. 5-7 are example graphs illustrating measurement results.

To generate a preview signal for the CFR algorithms a peak signal may be utilized as illustrated in the previous exemplary embodiments. The peak signal may be understood as an amplitude or power of peaks of the composite signal. The peak signal may be obtained using the following equation: $P=|S_A+S_B|$. If the peak signal is used in the wideband CFR configuration, then it may be obtained using the following calculation: $P=|S|$. In addition to the peak signal, also an envelope signal may be used to generate a preview signal for the CFR algorithms. The envelope signal may be generated as the sum of amplitude of the RF band specific composite signals. The envelope signal may be obtained using the following equation: $E=|S_A|+|S_B|$. FIG. 5 illustrates an exemplary representation of a peak signal 520 and an envelope signal 510 for a frequency gap between the bands of 80 MHz.

Figure 6:
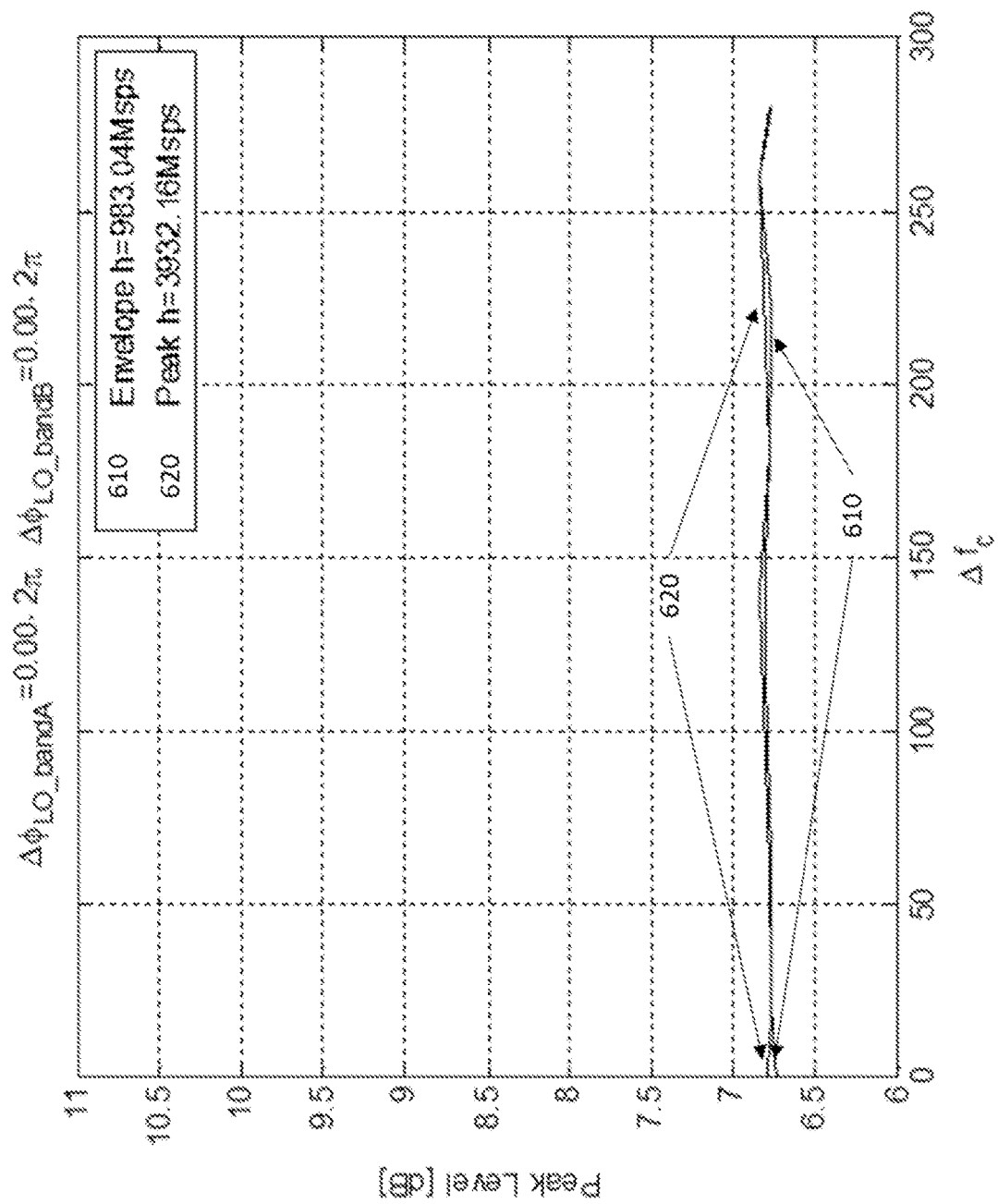

It is to be noted that a peak signal may be utilized in wideband and dual-band CFR. In case a peak signal is utilized for a dual-band CFR, an alignment of frequency and phase information of both RF bands in the preview processing path and in the main processing path is needed. If an envelope signal is utilized for the dual-band CFR, the envelope signal in the preview path is immune to possible phase and frequency deviation in each RF band in the preview processing path and in the main processing path. FIG. 6 illustrates an exemplary comparison of the PAR performance between a peak-signal based CFR 620 and an envelope-signal based CFR 610 with perfect phase alignment between the main processing path and the preview processing path. Each RF band in this example comprises three adjacent LTE20 carriers and the RF BW of each RF band is 60 MHz. As is illustrated, the peak level is approximately constant in case the dual band CFR utilizes the envelope signal or the peak signal. Therefore, no degradation occurs when a frequency gap Δf_c between the RF bands is decreasing in this example.

Figure 7:
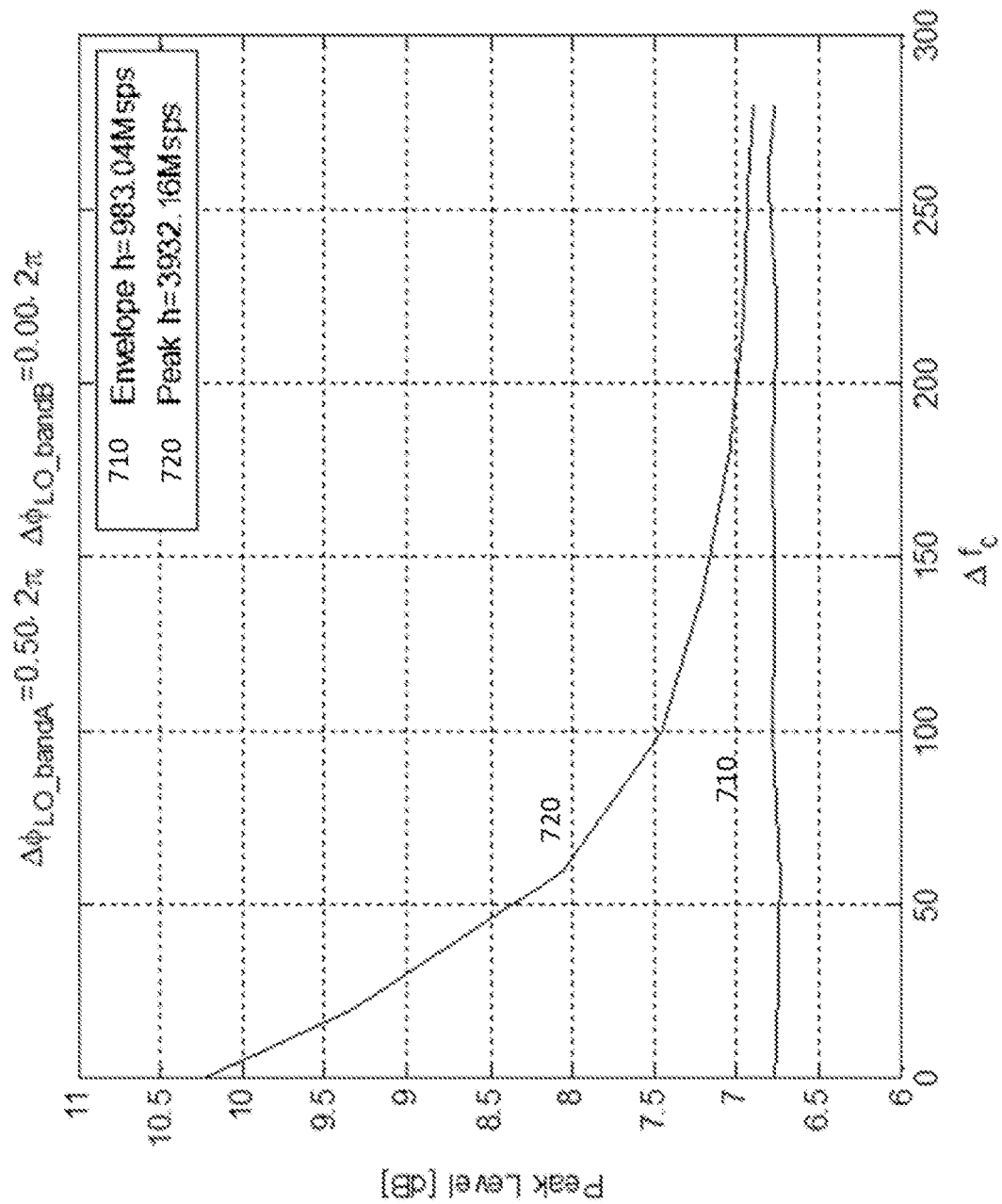

FIG. 7 illustrates an exemplary comparison of the PAR performance between a peak-signal based CFR 720 and an envelope-signal based CFR 710, both of them being misaligned. Carrier configuration is the same as in the example of FIG. 6. Phase misalignment is set to the maximum value 7 in this example. It is illustrated that the peak level is approximately constant in case of the dual-band CFR that utilizes the envelope signal. For the dual-band CFR that utilizes the peak signal, the peak level is strongly increasing when frequency gap Δf_c between bands is decreasing in this example.

The sampling rate in oversampling of the preview path for the peak-signal based dual-band CFR may be dependent on radio bandwidth, while the sampling rate in oversampling of the preview path for the envelope signal based dual-band CFR may be dependent on the maximum RF BW of all the RF bands. Therefore, a benefit of using the CFR algorithm that utilizes the envelope signal instead of peak signal in the preview path may be a significantly reduced need for sampling rates.

The power inside each RF band may be different and that may have an effect on an envelope signal based dual-band CFR. In such a situation the RF band with less power may suffer more due to unbalanced or unregulated clipping noise distribution. Therefore, it may get unintentionally more EVM compared to the RF band with higher power. EVM, error vector magnitude, may be understood as a measure used to quantify the performance of a digital radio transmitter or receiver. In some examples, EVM may be traded between the RF bands by applying weighing factors, weights. Yet incorporating band specific weights into the additive clipping pulses in the dual-band envelope CFR algorithm may be problematic in some examples. Usage of weights into the per-band specific CFR paths, in some examples, incorporates PAR degradation. For example, one may define band specific additive clipping pulses $C_{p,A}$ and $C_{p,B}$ and band specific clipping weights $V_A$ and $V_B$. In this example, the additive dual-band CFR algorithm based on envelope signal generates the following clipped envelope signal:

$$|E_z| = |S_A - C_{p,A}| + |S_B - C_{p,B}| =$$

$$\left| \underbrace{(1-V_a)S_A + V_A}_{\text{additional factors in } A} S_A \frac{Thr}{E'} \right| + \left| \underbrace{(1-V_B)S_B + V_B}_{\text{additional factors in } B} S_B \frac{Thr}{E'} \right|$$

If the clipping weights are $V_A=1$ and $V_B=1$ are the additional factors equal to zero and the multiplicative part for both RF bands is equal to one, thus one may obtain:

$$|E_z| = \left| \underbrace{0+1}_{\text{additional factors in } A} \cdot S_A \frac{Thr}{E'} \right| + \left| \underbrace{0+1}_{\text{additional factors in } B} \cdot S_B \frac{Thr}{E'} \right| =$$

$$(|S_A| + |S_B|)\frac{Thr}{E'} = \frac{E \cdot Thr}{E'} = \begin{cases} Thr & \text{when } E > Thr \\ E & \text{when } E \leq Thr \end{cases}$$

It may therefore be desirable to balance clipping noise between RF bands without increasing a PAR level of an output signal. By balancing clipping noise between the RF bands, the EVM level of carriers inside the RF bands may be affected. To achieve this, clipping pulses $C_{p,A}$ and $C_{p,B}$ for both RF bands separately may be provided with clipping noise balancing functionality. Consequently, signal such as $Z_A$ and $Z_B$ are hard clipped and produce an envelope signal $E_Z$ which is thereby also hard clipped. Additionally, in some examples, pulse shaping and protection against over-clipping may be utilized.

Some examples of calculations inside a single iteration of the CFR are discussed below. It is to be noted that the number of iterations is not limited in these examples. The number of iterations may depend on the target use cases for the processing chain. Also, the examples do not restrict how the clipping pulses are filtered to provide the best spectral properties, but instead, different methods may be utilized to handle this functionality depending on, for example, the requirements of the target implementation. For example, the filtering may be done using time domain finite impulse response, FIR, filter or frequency domain filter. The examples do not restrict how to suppress over-clipping that can occur during the filtering of the clipping pulses either. For example, the method to avoid over-clipping may be based on the windowing procedure or on pulse scaling procedure. The examples also do not restrict how the signals are processed inside of the bands. Both carrier and/or composite signals may be processed.

Figure 8:
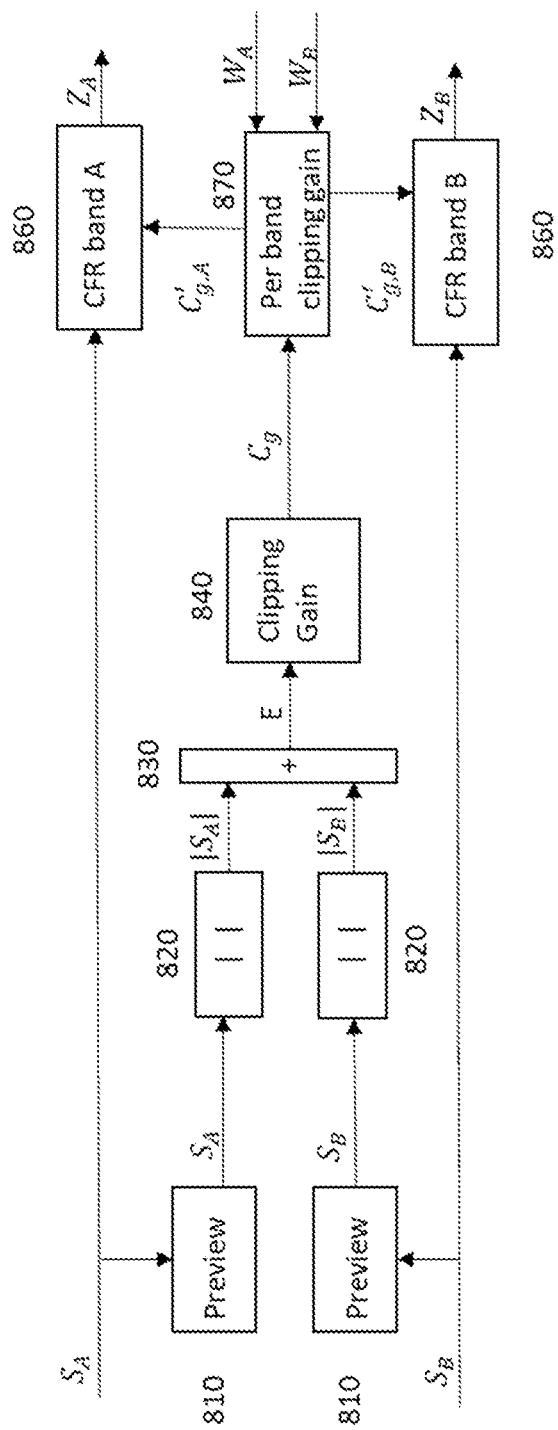
FIGS. 8-10 illustrate block diagrams of exemplary embodiments.

In an exemplary embodiment illustrated as a block diagram in FIG. 8, separate composite signals from each RF band of a dual-band configuration, $S_A$ and $S_B$, are obtained and used to generate band specific envelope signals $|S_A|$ and $|S_B|$. The term generate is used here although alternatively term determining could be used as well. The composite signal $S_A$ and $S_B$ are fed to RF band specific CFR, blocks 860 and to preview processing, blocks 810. From the preview processing the composite signals are then processed to determine the envelope signal in blocks 820 after which the RF band specific envelope signals are used, in block 830, to determine a preview envelope signal, E, for a CFR algorithm: $E=|S_A|+|S_B|$. Next, the preview envelope signal is processed to obtain a common clipping gain signal $C_g$ in block 840 after which in block 870 RF band specific weighing factors $W_A$ and $W_A$ are combined to the common clipping gain signal $C_g$ to determine the band specific clipping gain constrain signal $C'_{g,A}$ and $C'_{g,B}$ that are then used for band-specific CFR in block 860. It is to be noted that determining may be understood as obtaining and/or defining in some exemplary embodiments.

In this exemplary embodiment, the sampling rate of the preview envelope signal E is higher compared to either sample rate of the composite signal $S_A$ in RF band A and composite signal $S_B$ in RF band B. The sample rate may be chosen according to application specific requirements of a target architecture.

In this exemplary embodiment, a clipping threshold is described as Thr. Therefore, the common clipping gain signal may be defined as:

$$C_g = \max(E-Thr,0) = \max(E,Thr)-Thr$$

Figure 9:
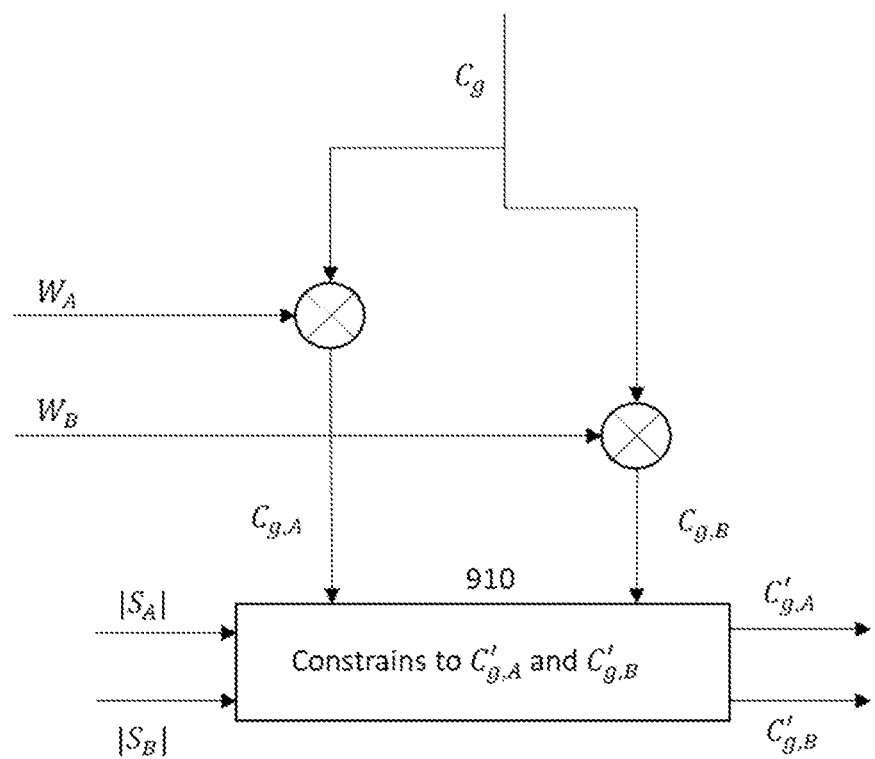

Then weighted clipping gain signals for RF band A and RF band B may be defined as: $C_{g,A}=W_A C_g$ and $C_{g,B}=W_B C_g$, where $W_A$ and $W_B$ are RF band specific weights for RF band A and RF band B. This is illustrated in FIG. 9. The band specific weights in this exemplary embodiment fulfil the condition $W_A+W_B=1$. Both clipping gain signals $C_{g,A}$ and $C_{g,B}$ may be constrained 910. The constraining may be done, for example, by using the following conditions:

Initialize:
  $C'_{g,A}=C_{g,A}$ and $C'_{g,B}=C_{g,B}$
Constrain to $C_{g,A}$
  If $C_{g,A}>|S_A|$, then $C'_{g,A}=|S_A|$ and $C'_{g,B}=|S_B|-$Thr.
Constrain to $C_{g,B}$
  If $C_{g,B}>|S_B|$, then $C'_{g,B}=|S_B|$ and $C'_{g,A}=|S_A|-$Thr.

These restrictions are imposed by the initial constrains $0 \leq |Z_A| \leq $Thr and $0 \leq |Z_A| \leq $Thr. It is to be noted that the above constrains are examples that illustrates a simplified dual-band subcase of constrains for a multiband system. In another example, constrains for a multiband system (set of bands $\mathcal{K} = \{A, B, C, \ldots X, \ldots\}$) may follow the conditions indicated below:

Initialize:
  For $k \in \mathcal{K}$ do $C'_{g,k}=C_{g,k}$
Step 1: Limiting constrain to the subset of bands
  $\mathcal{L} = \{k \in K | C_{g,k} > |S_k|\}$
  For $k \in \mathcal{L}$ do $C'_{g,k}=|S_k|$
Step 2: Normalizing constrain to the subset of bands $\mathcal{U} = \mathcal{K} \setminus \mathcal{L}$
  For $k \in \mathcal{U}$ do $$C'_{g,k} = |S_k| - \frac{(|s_k| - c'_{g,k})}{\sum_{l \in U}(|s_l| - c'_{g,l})} \cdot Thr$$

It is to be noted that in this example the subset $\mathcal{L} = \{k \in \mathcal{K} | C_{g,k} > |S_k|\}$ comprises all bands k from the set $\mathcal{K}$ for which the condition $C_{g,k} > |S_k|$ is true. The band specific weights in this example fulfill the condition $\sum_{k \in \mathcal{K}} W_k = 1$. In a dual-band example a set of bands may be $\mathcal{K} = \{A, B\}$. In such an example, if the limiting constrain (Step 1) is applied to the subset of bands $\mathcal{K} = \{B\}$, then the normalizing constrain (Step 2) is applied to the subset of bands $\mathcal{U} = \{A\}$. In another example, a multiband with five bands example, the set of bands may be $\mathcal{K} = \{A, B, C, D, E\}$. In such an example, if the limiting constrain (Step 1) is applied to the subset of bands $\mathcal{L} = \{A, B, D\}$, then the normalizing constrain (Step 2) is applied to the subset of bands $\mathcal{U} = \{C, E\}$.

Combined signals $S_A$ and $S_B$ separately for RF band A and RF band B may be clipped using the equations:

$$Z_A = S_A - \exp(1i\angle S_A) \cdot C'_{g,A}$$

$$Z_B = S_B - \exp(1i\angle S_B) \cdot C'_{g,B}$$

In this exemplary embodiment, the component $\exp(1i\angle S_A)$ and $\exp(1i\angle S_B)$ may also be extracted as $$\exp(1iLS_A) = \frac{S_A}{|S_A|} \text{ and } \exp(1iLS_B) = \frac{S_B}{|S_B|}$$

and an RF band specific pulse may be defined as $$C_{p,A} = \exp(1i\angle S_A) \cdot C'_{g,A}$$

$$C_{p,B} = \exp(1i\angle S_B) \cdot C'_{g,B}$$

Figure 10:
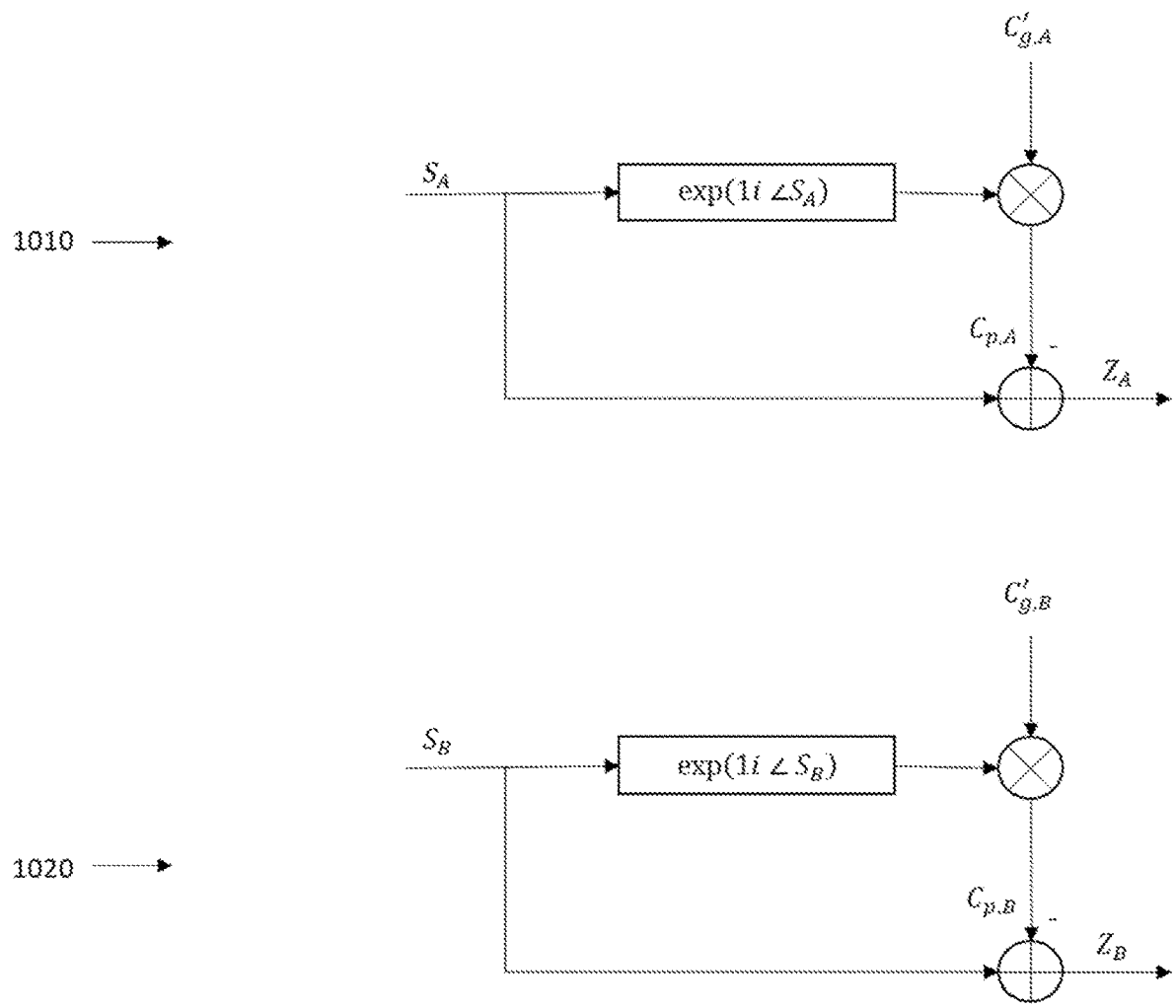

FIG. 10 illustrates block diagram according to exemplary embodiments of the structure of the CFR RF band A 1010 and the structure of the CFR RF band B 1020. In this exemplary embodiment, the combination of the clipped signals in the RF bands A and B is $Z = Z_A + Z_B$. The envelope $E_Z$ of the clipped combined signal Z may be determined as $$E_Z = |Z_A| + |Z_B| = |S_A - \exp(1i\angle S_A) \cdot C'_{g,A}| + |S_B - \exp(1i\angle S_B) \cdot C'_{g,B}|$$

The clipped envelope may be determined as $$E_Z = |S_A| - W_A C_g + |S_B| - W_B C_g = E - C_g(W_A + W_B) = E - C_g$$

Therefore, two possible clipped envelopes may be obtained depending on the unclipped envelope E:

$$E_Z = E - C_g = E - \max(E - Thr, 0) = \begin{cases} Thr & \text{when } E > Thr \\ E & \text{when } E \leq Thr \end{cases}$$

The above discussed exemplary embodiments may have a benefit of CFR not limiting the radio bandwidth in case of dual-band, or multi-band, use cases.

Figure 11:
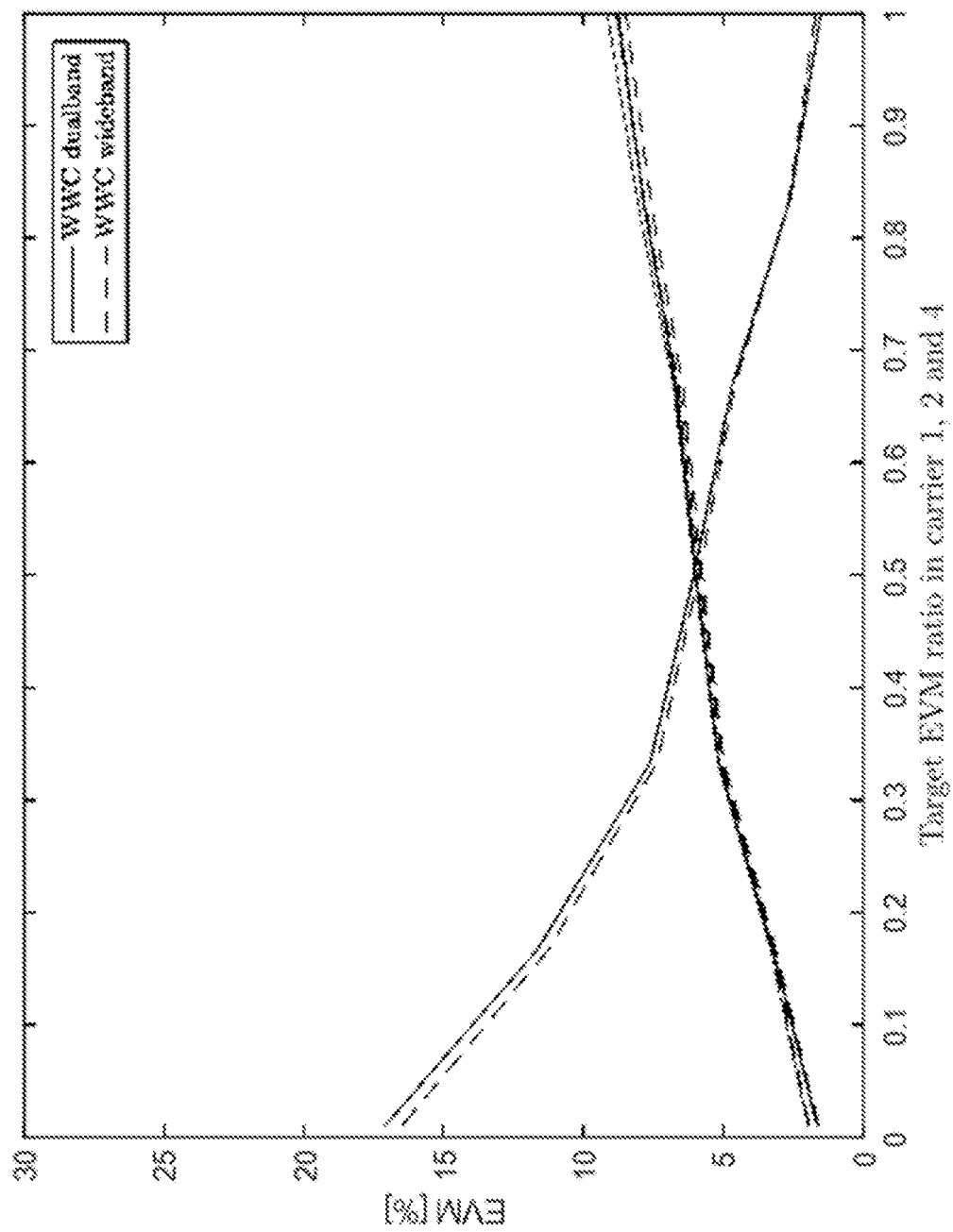
FIGS. 11 and 12 are example graphs illustrating measurement results.
Figure 12:
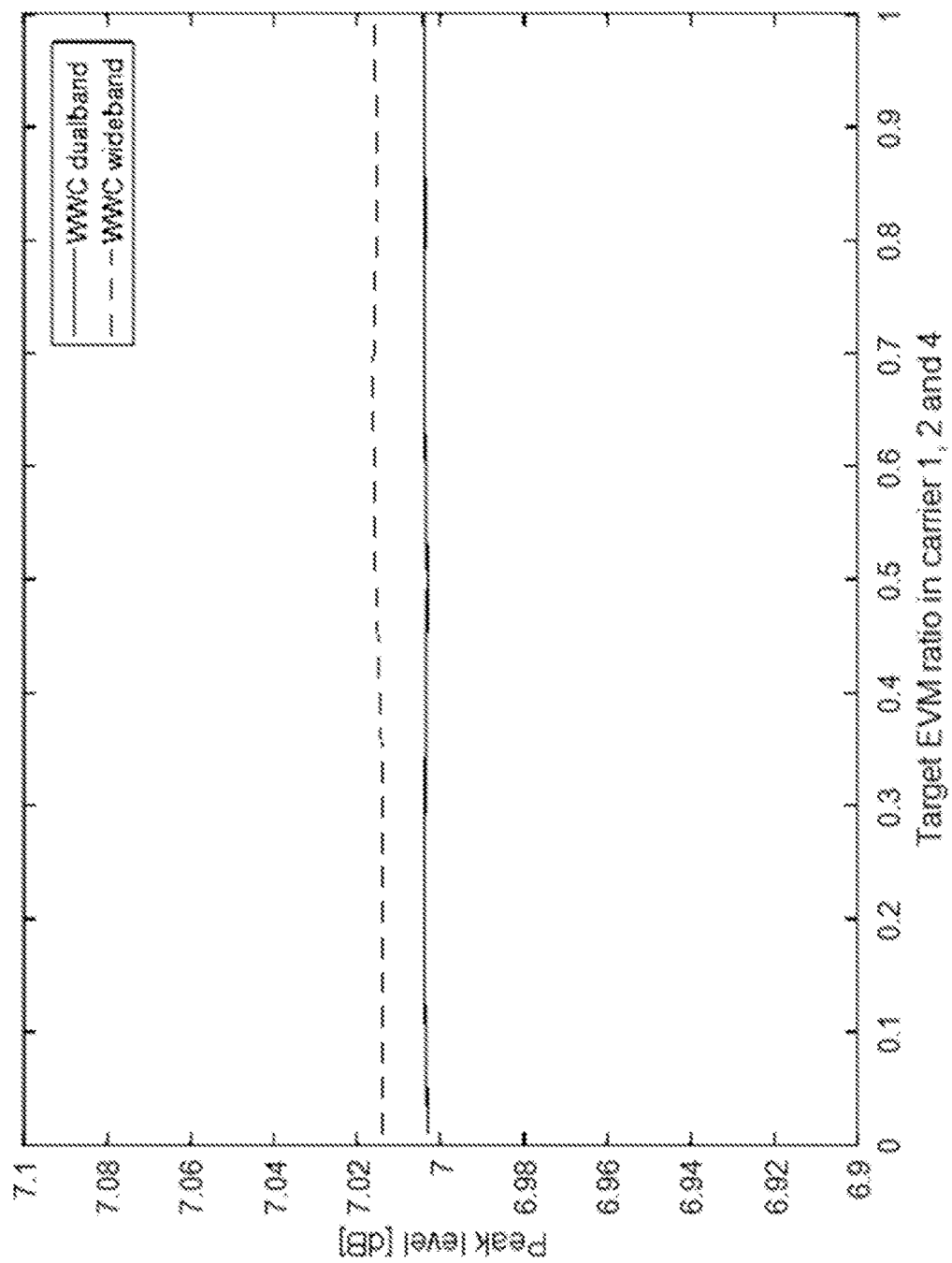

FIGS. 11 and 12 illustrate exemplary performance results of dual-band envelope-signal based CFR, including pulse shaping and over-clipping protection compared with the wideband CFR with the same pulse shaping and over-clipping protection as a reference. In each band two LTE20 carriers are used. Band B has 6 dB higher power compared to band A. Maximum RF BW is 60 MHz, radio bandwidth is 400 MHz and the frequency gap Δf_c is 180 MHz. In the CFR algorithm used, the target PAR is set to 7 dB. The clipping noise is deliberately adjusted between carriers. Carrier number 1, 2 and 4 have the same clipping noise balancing ratio, whereas carrier number 3 has the opposite clipping noise balancing ratio. The EVM performance results are depicted in FIG. 11. Dashed lines represent the high effort EVM reference of the carriers at the output of the wideband CFR algorithm. Solid lines represent the EVM of the carriers at the output of the dual-band CFR algorithm. Both algorithms provide comparable performance in meaning of the EVM and the PAR of the output signal.

Target EVM ratio for carrier 1, 2 and 4 is the same (see blue, green and orange solid and dashed lines). Target EVM ratio for carrier number 3 is on the opposite value (see solid and dashed lines), as shown by the following equation:

Target_EVM_ratio_in_carrier_3 = 1 − Target_EVM_ratio_in_carrier_1_2_and_4

Performance results for the PAR as a function of target EVM ratios are illustrated in FIG. 12. Both algorithms provide comparable PAR results. The provided dual-band CFR using envelope signal does not have any performance degradation due to target EVM ratio balancing between carriers and bands.

The exemplary embodiments discussed above may further have benefits including good EVM balancing without PAR degradation, lower power consumption compared to the CFR in wideband mode, immunity for phase and frequency misalignment between bands in main and preview path, lower sampling rates in the preview path, reduced requirements for the filtering chain, lower amount of hardware resources in the DFE, lower power consumption of the DFE, possibility to use separate non-coherent DAC with lower sampling rates compared to wideband signal and possibility to use non-coherent carrier up-converters in the analogue domain to carrier frequency up-convert signals separately for band A and band B.

Embodiments described herein may be implemented in a communication system, such as in at least one of the following: Global System for Mobile Communications (GSM) or any other second generation cellular communication system, Universal Mobile Telecommunication System (UMTS, 3G) based on basic wideband-code division multiple access (W-CDMA), high-speed packet access (HSPA), Long Term Evolution (LTE), LTE-Advanced, a system based on IEEE 802.11 specifications, a system based on IEEE 802.15 specifications, and/or a fifth generation (5G) mobile or cellular communication system. The embodiments are not, however, restricted to the system given as an example but a person skilled in the art may apply the solution to other communication systems provided with necessary properties.

Figure 13:
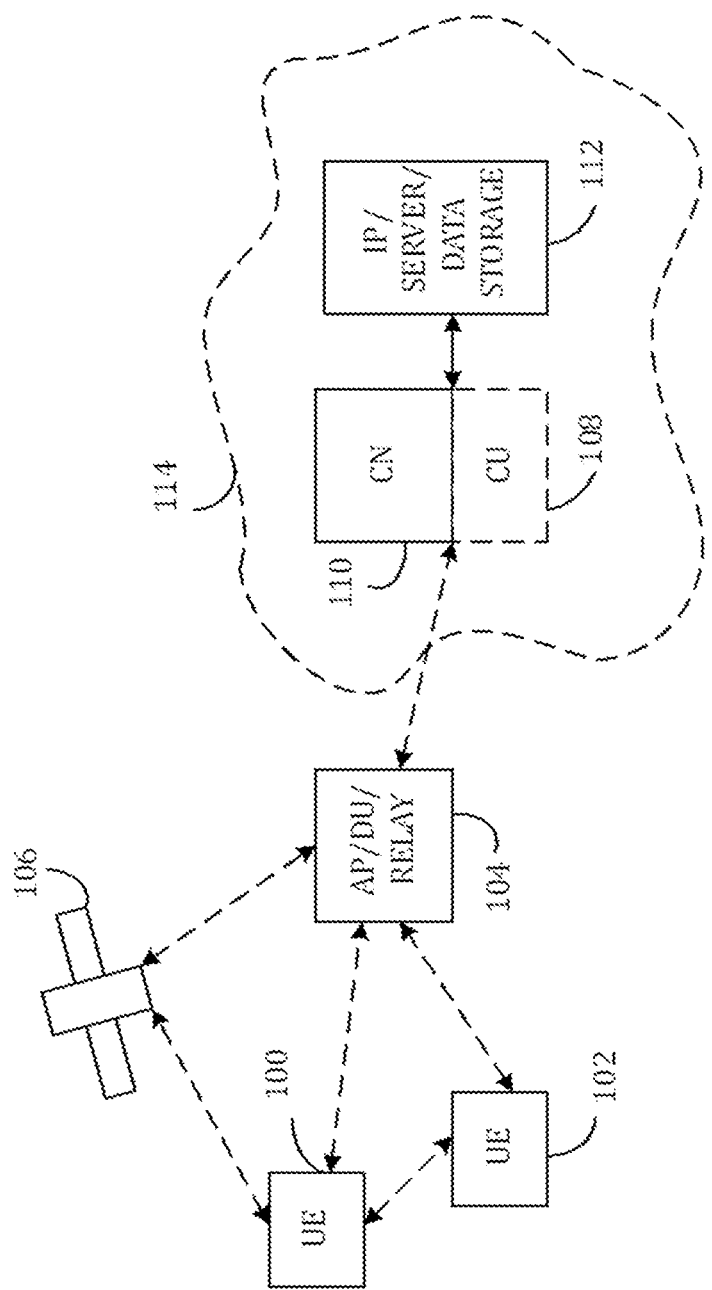
FIG. 13 illustrates an exemplary embodiment of a communication network.

FIG. 13 depicts examples of simplified system architectures only showing some elements and functional entities, all being logical units, whose implementation may differ from what is shown. The connections shown in FIG. 13 are logical connections; the actual physical connections may be different. It is apparent to a person skilled in the art that the system typically comprises also other functions and structures than those shown in FIG. 13. The example of FIG. 13 shows a part of an exemplifying radio access network.

FIG. 13 shows terminal devices 100 and 102 configured to be in a wireless connection on one or more communication channels in a cell with an access node (such as (e/g) NodeB) 104 providing the cell. The access node 104 may also be referred to as a node. The physical link from a terminal device to a (e/g)NodeB is called uplink or reverse link and the physical link from the (e/g)NodeB to the terminal device is called downlink or forward link. It should be appreciated that (e/g)NodeBs or their functionalities may be implemented by using any node, host, server or access point etc. entity suitable for such a usage. It is to be noted that although only one cell is discussed in this exemplary embodiment, for the sake of simplicity of explanation, multiple cells may be provided by one access node in some exemplary embodiments.

A communication system typically comprises more than one (e/g)NodeB in which case the (e/g)NodeBs may also be configured to communicate with one another over links, wired or wireless, designed for the purpose. These links may be used for signalling purposes. The (e/g)NodeB is a computing device configured to control the radio resources of communication system it is coupled to. The NodeB may also be referred to as a base station, an access point or any other type of interfacing device including a relay station capable of operating in a wireless environment. The (e/g)NodeB includes or is coupled to transceivers. From the transceivers of the (e/g)NodeB, a connection is provided to an antenna unit that establishes bi-directional radio links to user devices. The antenna unit may comprise a plurality of antennas or antenna elements. The (e/g)NodeB is further connected to core network 110 (CN or next generation core NGC). Depending on the system, the counterpart on the CN side can be a serving gateway (S-GW, routing and forwarding user data packets), packet data network gateway (P-GW), for providing connectivity of terminal devices (UEs) to external packet data networks, or mobile management entity (MME), etc.

The terminal device (also called UE, user equipment, user terminal, user device, etc.) illustrates one type of an apparatus to which resources on the air interface are allocated and assigned, and thus any feature described herein with a terminal device may be implemented with a corresponding apparatus, such as a relay node. An example of such a relay node is a layer 3 relay (self-backhauling relay) towards the base station. Another example of such a relay node is a layer 2 relay. Such a relay node may contain a terminal device part and a Distributed Unit (DU) part. A CU (centralized unit) may coordinate the DU operation via F1AP-interface for example.

The terminal device typically refers to a portable computing device that includes wireless mobile communication devices operating with or without a subscriber identification module (SIM), or an embedded SIM, eSIM, including, but not limited to, the following types of devices: a mobile station (mobile phone), smartphone, personal digital assistant (PDA), handset, device using a wireless modem (alarm or measurement device, etc.), laptop and/or touch screen computer, tablet, game console, notebook, and multimedia device. It should be appreciated that a user device may also be a nearly exclusive uplink only device, of which an example is a camera or video camera loading images or video clips to a network. A terminal device may also be a device having capability to operate in Internet of Things (IoT) network which is a scenario in which objects are provided with the ability to transfer data over a network without requiring human-to-human or human-to-computer interaction. The terminal device may also utilise cloud. In some applications, a terminal device may comprise a small portable device with radio parts (such as a watch, earphones or eyeglasses) and the computation is carried out in the cloud. The terminal device (or in some embodiments a layer 3 relay node) is configured to perform one or more of user equipment functionalities.

Various techniques described herein may also be applied to a cyber-physical system (CPS) (a system of collaborating computational elements controlling physical entities). CPS may enable the implementation and exploitation of massive amounts of interconnected ICT devices (sensors, actuators, processors microcontrollers, etc.) embedded in physical objects at different locations. Mobile cyber physical systems, in which the physical system in question has inherent mobility, are a subcategory of cyber-physical systems. Examples of mobile physical systems include mobile robotics and electronics transported by humans or animals.

Additionally, although the apparatuses have been depicted as single entities, different units, processors and/or memory units (not all shown in FIG. 13) may be implemented.

5G enables using multiple input—multiple output (MIMO) antennas, many more base stations or nodes than the LTE (a so-called small cell concept), including macro sites operating in co-operation with smaller stations and employing a variety of radio technologies depending on service needs, use cases and/or spectrum available. 5G mobile communications supports a wide range of use cases and related applications including video streaming, augmented reality, different ways of data sharing and various forms of machine type applications such as (massive) machine-type communications (mMTC), including vehicular safety, different sensors and real-time control. 5G is expected to have multiple radio interfaces, namely below 6 GHz, cmWave and mmWave, and also being integratable with existing legacy radio access technologies, such as the LTE. Integration with the LTE may be implemented, at least in the early phase, as a system, where macro coverage is provided by the LTE and 5G radio interface access comes from small cells by aggregation to the LTE. In other words, 5G is planned to support both inter-RAT operability (such as LTE-5G) and inter-RI operability (inter-radio interface operability, such as below 6 GHz—cmWave, below 6 GHz—cmWave—mmWave). One of the concepts considered to be used in 5G networks is network slicing in which multiple independent and dedicated virtual sub-networks (network instances) may be created within the same infrastructure to run services that have different requirements on latency, reliability, throughput and mobility.

The current architecture in LTE networks is fully distributed in the radio and fully centralized in the core network. The low latency applications and services in 5G require to bring the content close to the radio which leads to local break out and multi-access edge computing (MEC). 5G enables analytics and knowledge generation to occur at the source of the data. This approach requires leveraging resources that may not be continuously connected to a network such as laptops, smartphones, tablets and sensors. MEC provides a distributed computing environment for application and service hosting. It also has the ability to store and process content in close proximity to cellular subscribers for faster response time. Edge computing covers a wide range of technologies such as wireless sensor networks, mobile data acquisition, mobile signature analysis, cooperative distributed peer-to-peer ad hoc networking and processing also classifiable as local cloud/fog computing and grid/mesh computing, dew computing, mobile edge computing, cloudlet, distributed data storage and retrieval, autonomic self-healing networks, remote cloud services, augmented and virtual reality, data caching, Internet of Things (massive connectivity and/or latency critical), critical communications (autonomous vehicles, traffic safety, real-time analytics, time-critical control, healthcare applications).

The communication system is also able to communicate with other networks, such as a public switched telephone network or the Internet 112, or utilise services provided by them. The communication network may also be able to support the usage of cloud services, for example at least part of core network operations may be carried out as a cloud service (this is depicted in FIG. 13 by "cloud" 114). The communication system may also comprise a central control entity, or a like, providing facilities for networks of different operators to cooperate for example in spectrum sharing.

Edge cloud may be brought into radio access network (RAN) by utilizing network function virtualization (NFV) and software defined networking (SDN). Using edge cloud may mean access node operations to be carried out, at least partly, in a server, host or node operationally coupled to a remote radio head or base station comprising radio parts. It is also possible that node operations will be distributed among a plurality of servers, nodes or hosts. Application of cloudRAN architecture enables RAN real time functions being carried out at the RAN side (in a distributed unit, DU 104) and non-real time functions being carried out in a centralized manner (in a centralized unit, CU 108).

It should also be understood that the distribution of labour between core network operations and base station operations may differ from that of the LTE or even be non-existent. Some other technology probably to be used are Big Data and all-IP, which may change the way networks are being constructed and managed. 5G (or new radio, NR) networks are being designed to support multiple hierarchies, where MEC servers can be placed between the core and the base station or nodeB (gNB). It should be appreciated that MEC can be applied in 4G networks as well.

5G may also utilize satellite communication to enhance or complement the coverage of 5G service, for example by providing backhauling. Possible use cases are providing service continuity for machine-to-machine (M2M) or Internet of Things (IoT) devices or for passengers on board of vehicles, or ensuring service availability for critical communications, and future railway/maritime/aeronautical communications. Satellite communication may utilise geostationary earth orbit (GEO) satellite systems, but also low earth orbit (LEO) satellite systems, in particular mega-constellations (systems in which hundreds of (nano)satellites are deployed). Each satellite 106 in the mega-constellation may cover several satellite-enabled network entities that create on-ground cells. The on-ground cells may be created through an on-ground relay node 104 or by a gNB located on-ground or in a satellite.

It is to be noted that the depicted system is only an example of a part of a radio access system and in practice, the system may comprise a plurality of (e/g)NodeBs, the terminal device may have an access to a plurality of radio cells and the system may comprise also other apparatuses, such as physical layer relay nodes or other network elements, etc. At least one of the (e/g)NodeBs may be a Home(e/g)nodeB. Additionally, in a geographical area of a radio communication system a plurality of different kinds of radio cells as well as a plurality of radio cells may be provided. Radio cells may be macro cells (or umbrella cells) which are large cells, usually having a diameter of up to tens of kilometers, or smaller cells such as micro-, femto- or picocells. The (e/g)NodeBs of FIG. 1 may provide any kind of these cells. A cellular radio system may be implemented as a multilayer network including several kinds of cells. Typically, in multilayer networks, one access node provides one kind of a cell or cells, and thus a plurality of (e/g)NodeBs are required to provide such a network structure.

For fulfilling the need for improving the deployment and performance of communication systems, the concept of "plug-and-play" (e/g)NodeBs has been introduced. Typically, a network which is able to use "plug-and-play" (e/g)Node Bs, includes, in addition to Home (e/g)NodeBs (H(e/g)nodeBs), a home node B gateway, or HNB-GW (not shown in FIG. 1). A HNB Gateway (HNB-GW), which is typically installed within an operator's network may aggregate traffic from a large number of HNBs back to a core network.

Even though the invention has been described above with reference to an example according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. An apparatus comprising at least one processor, and at least one non-transitory memory including a computer program code, wherein the at least one memory and the computer program code are configured, with the at least one processor, to cause the apparatus to:
   obtain a first radio signal and a second radio signal, wherein the first radio signal is different from the second radio signal;
   determine a first envelope signal based on the first radio signal and a second envelope signal based on the second radio signal, wherein the first envelope signal is different from the second envelope signal;
   determine a preview envelope signal based on the first envelope signal and the second envelope signal;
   determine a common clipping gain signal based on the preview envelope signal;
   determine a first clipping gain signal based on the common clipping gain signal and a first weighing factor;
   determine a second clipping gain signal based on the common clipping gain signal and a second weighing factor;
   wherein the first clipping gain signal is different from the second clipping gain signal;
   wherein the first weighing factor is different from the second weighing factor;
   perform a first crest factor reduction for the first radio signal utilizing the first clipping gain signal; and
   perform a second crest factor reduction for the second radio signal utilizing the second clipping gain signal.

2. An apparatus according to claim 1, wherein at least one of the first clipping gain signal or the second clipping gain signal is constrained.

3. An apparatus according to claim 2, wherein:
   the first clipping gain signal is constrained with the first envelope signal and the first weighing factor to determine a first clipping gain constrain signal; or
   the second clipping gain signal is constrained with the second envelope signal and the second weighing factor to determine a second clipping gain constrain signal.

4. An apparatus according to claim 1, wherein the first radio signal is placed at a first radio frequency bandwidth and the second radio signal is placed at a second radio frequency bandwidth, different from the first radio frequency bandwidth.

5. An apparatus according to claim 1, wherein the first and/or the second crest factor reduction comprises a plurality of crest factor reduction iterations.

6. An apparatus according to claim 1, wherein the first and the second radio signals comprise a composite signal or a carrier signal.

7. An apparatus according to claim 1 wherein the at least one memory and the computer program code are further configured, with the at least one processor, to cause the apparatus to pulse shape and protect against over-clipping.

8. An apparatus according to claim 1 wherein the apparatus is a radio frequency unit.

9. An apparatus according to claim 1 wherein the apparatus is comprised in a terminal device or an access node.

10. An apparatus according to claim 1, wherein the first weighing factor and the second weighing factor sum to a value, the value being less than one when there are more than two weighing factors, and the value being equal to one when there are two weighing factors.

11. A method comprising:
obtaining a first radio signal and a second radio signal, wherein the first radio signal is different from the second radio signal;
determining a first envelope signal based on the first radio signal and a second envelope signal based on the second radio signal, wherein the first envelope signal is different from the second envelope signal;
determining a preview envelope signal based on the first envelope signal and the second envelope signal;
determining a common clipping gain signal based on the preview envelope signal;
determining a first clipping gain signal based on the common clipping gain signal and a first weighing factor;
determining a second clipping gain signal based on the common clipping gain signal and a second weighing factor;
wherein the first clipping gain signal is different from the second clipping gain signal,
wherein the first weighing factor is different from the second weighing factor;
performing a first crest factor reduction for the first radio signal utilizing the first clipping gain signal; and
performing a second crest factor reduction for the second radio signal utilizing the second clipping gain signal.

12. A method according to claim 11, wherein at least one of the first clipping gain signal or the second clipping gain signal is constrained.

13. A method according to claim 11, wherein the first radio signal is placed at a first radio frequency bandwidth and the second radio signal is placed at a second radio frequency bandwidth, different from the first radio frequency bandwidth.

14. A method according to claim 11 wherein the first and/or the second crest factor reduction comprises a plurality of crest factor reduction iterations.

15. A method according to claim 11, wherein the first and the second radio signals comprise a composite signal or a carrier signal.

16. A method according to claim 11 the method further comprising pulse shaping and protecting against over-clipping.

17. A non-transitory computer readable medium comprising program instructions for causing an apparatus to perform at least the following:
obtaining a first radio signal and a second radio signal, wherein the first radio signal is different from the second radio signal;
determining a first envelope signal based on the first radio signal and a second envelope signal based on the second radio signal, wherein the first envelope signal is different from the second envelope signal;
determining a preview envelope signal based on the first envelope signal and the second envelope signal;
determining a common clipping gain signal based on the preview envelope signal;
determining a first clipping gain signal based on the common clipping gain signal and a first weighing factor;
determining a second clipping gain signal based on the common clipping gain signal and a second weighing factor;
wherein the first clipping gain signal is different from the second clipping gain signal;
wherein the first weighing factor is different from the second weighing factor;
performing a first crest factor reduction for the first radio signal utilizing the first clipping gain signal; and
performing a second crest factor reduction for the second radio signal utilizing the second clipping gain signal.

18. A non-transitory computer readable medium according to claim 17, wherein at least one of the first clipping gain signal or the second clipping gain signal is constrained.

19. A non-transitory computer readable medium according to claim 17, wherein the first radio signal is placed at a first radio frequency bandwidth and the second radio signal is placed at a second radio frequency bandwidth, different from the first radio frequency bandwidth.

20. A non-transitory computer readable medium according to claim 17 wherein the first and/or the second crest factor reduction comprises a plurality of crest factor reduction iterations.

21. A non-transitory computer readable medium according to claim 17, wherein the first and the second radio signals comprise a composite signal or a carrier signal.

22. A non-transitory computer readable medium according to claim 17 the non-transitory computer readable medium further comprising pulse shaping and protecting against over-clipping.

* * * * *